US010424669B2

United States Patent
Guo et al.

(10) Patent No.: US 10,424,669 B2
(45) Date of Patent: Sep. 24, 2019

(54) ARRAY SUBSTRATE AND MANUFACTURING METHOD THEREOF, AND DISPLAY DEVICE

(71) Applicants: BOE TECHNOLOGY GROUP CO., LTD., Beijing (CN); ORDOS YUANSHENG OPTOELECTRONICS CO., LTD., Ordos, Inner Mongolia (CN)

(72) Inventors: Zhixuan Guo, Beijing (CN); Fengguo Wang, Beijing (CN); Xinguo Wu, Beijing (CN); Hong Liu, Beijing (CN); Zifeng Wang, Beijing (CN); Yuanbo Li, Beijing (CN); Feng Li, Beijing (CN); Bo Ma, Beijing (CN)

(73) Assignees: BOE TECHNOLOGY GROUP CO., LTD., Beijing (CN); ORDOS YUANSHENG OPTOELECTRONICS CO., LTD., Ordos, Inner Mongolia (CN)

( * ) Notice: Subject to any disclaimer, the term of this patent is extended or adjusted under 35 U.S.C. 154(b) by 0 days.

(21) Appl. No.: 15/747,687

(22) PCT Filed: Jun. 27, 2017

(86) PCT No.: PCT/CN2017/090363
§ 371 (c)(1),
(2) Date: Jan. 25, 2018

(87) PCT Pub. No.: WO2018/120691
PCT Pub. Date: Jul. 5, 2018

(65) Prior Publication Data
US 2019/0006524 A1 Jan. 3, 2019

(30) Foreign Application Priority Data

Dec. 28, 2016 (CN) .......................... 2016 1 1238390

(51) Int. Cl.
H01L 29/786 (2006.01)
H01L 27/12 (2006.01)
(Continued)

(52) U.S. Cl.
CPC ...... *H01L 29/78636* (2013.01); *G02F 1/1368* (2013.01); *G02F 1/136209* (2013.01);
(Continued)

(58) Field of Classification Search
None
See application file for complete search history.

(56) References Cited

U.S. PATENT DOCUMENTS

2002/0113927 A1* 8/2002 Ha .................... G02F 1/133553
349/113
2010/0157211 A1 6/2010 Kim et al.
(Continued)

FOREIGN PATENT DOCUMENTS

CN 102540601 A 7/2012
CN 103199095 A 7/2013
(Continued)

OTHER PUBLICATIONS

The International Search Report and Written Opinion dated Sep. 28, 2017; PCT/CN2017/090363.

*Primary Examiner* — Bilkis Jahan
(74) *Attorney, Agent, or Firm* — Ladas & Parry LLP

(57) ABSTRACT

An array substrate, a manufacturing method thereof, and a display device are provided. The array substrate includes a base substrate; a first conductive layer located on the base substrate, including a source electrode of a switching element; and a color filter layer located on the first conductive layer, wherein the source electrode of the switching element and the color filter layer are abutted in a direction perpendicular to the base substrate.

16 Claims, 5 Drawing Sheets

(51) Int. Cl.
*G02F 1/1368* (2006.01)
*G02F 1/1362* (2006.01)
(52) U.S. Cl.
CPC .. *G02F 1/136227* (2013.01); *G02F 1/136286* (2013.01); *H01L 27/124* (2013.01); *H01L 27/1222* (2013.01); *H01L 27/1248* (2013.01); *H01L 27/1262* (2013.01); *H01L 29/78633* (2013.01); *H01L 29/78675* (2013.01); *G02F 2001/136222* (2013.01); *G02F 2001/136295* (2013.01)

(56) References Cited

U.S. PATENT DOCUMENTS

| | | | |
|---|---|---|---|
| 2013/0120683 A1 | 5/2013 | Lin et al. | |
| 2014/0084259 A1* | 3/2014 | Kim | H01L 51/5237 257/40 |
| 2015/0179668 A1 | 6/2015 | Niu | |
| 2015/0227013 A1* | 8/2015 | Hao | G02F 1/136286 349/46 |
| 2016/0126258 A1* | 5/2016 | Liu | H01L 27/124 257/72 |
| 2016/0202400 A1* | 7/2016 | Lee | G02B 5/206 257/40 |
| 2016/0307976 A1* | 10/2016 | You | H01L 27/3246 |
| 2017/0097534 A1* | 4/2017 | Shin | G02F 1/133377 |

FOREIGN PATENT DOCUMENTS

| | | |
|---|---|---|
| CN | 103676390 A | 3/2014 |
| CN | 103779360 A | 5/2014 |
| CN | 205723536 U | 11/2016 |

\* cited by examiner

ARRAY SUBSTRATE AND MANUFACTURING METHOD THEREOF, AND DISPLAY DEVICE

TECHNICAL FIELD

The embodiments of the present disclosure relate to an array substrate, a manufacturing method thereof and a display device.

BACKGROUND

Thin film transistor liquid crystal displays (TFT-LCDs) are commonly used as flat panel displays. The liquid crystal displays are widely used in modern digital information apparatuses due to advantages such as small size, low power consumption, no radiation, and high resolution.

SUMMARY

The embodiments of the present disclosure provide an array substrate, a manufacturing method thereof and a display device.

The embodiments of the present disclosure provide an array substrate, comprising: a base substrate, a first conductive layer located on the base substrate, the first conductive layer comprising a source electrode of a switching element, and a color filter layer located on the first conductive layer, wherein, the source electrode of the switching element and the color filter layer are abutted in a direction perpendicular to the base substrate.

In an example, the array substrate further comprising: a second conductive layer located on the color filter layer, the second conductive layer comprising a common electrode, wherein, the color filter layer and the common electrode are further abutted in the direction perpendicular to the base substrate.

In an example, the first conductive layer further comprises a data line connected to the source electrode of the switching element, and the second conductive layer further comprises a common line connected to the common electrode, and the color filter layer is configured to electrically isolate the data line from the common line at an intersection of the data line and the common line.

In an example, the color filter layer comprises a first color filter pattern, a second color filter pattern and a first opening located between the first color filter pattern and the second color filter pattern and passing through the color filter layer, the first color filter pattern and the second color filter pattern being adjacent to each other and different in color; the first conductive layer further comprises a drain electrode of the switching element, a part of the drain electrode is exposed by the opening, the drain electrode of the switching element overlaps with the first color filter pattern and the second color filter pattern in the direction perpendicular to the base substrate.

In an example, the array substrate further comprising: a passivation layer located on the second conductive layer; and a pixel electrode layer located on the passivation layer, wherein a via hole is formed in the passivation layer, the via hole is located directly above the part of the drain electrode exposed by the opening, and the pixel electrode layer is connected to the drain electrode of the switching element through the via hole.

In an example, the first conductive layer further comprises a data line connected to the source electrode of the switching element, and at least a part of an interface between the first color filter pattern and the second color filter pattern is located directly above the data line.

In an example, at least a part of an interface between the first color filter pattern and the second color filter pattern is located directly above the data line.

In an example, the color filter layer further comprises a third color filter pattern adjacent to the first color filter pattern and a gate line connected to a gate electrode of the switching element, the first color filter pattern and the third color filter pattern being different in color; wherein at least a part of an interface between the first color filter pattern and the third color filter pattern is located directly above the gate line.

In an example, a material of the color filter layer is a photoresist resin.

Another embodiment of the present disclosure provides a display device comprising any one of the above-mentioned array substrates.

Another embodiment of the present disclosure provides a manufacturing method of an array substrate, comprising: forming a first conductive layer on a base substrate, the first conductive layer comprising a source electrode of a switching element; and forming a color filter layer on the first conductive layer, wherein the color filter layer and the source electrode of the switching element are abutted in a direction perpendicular to the base substrate.

In an example, the manufacturing method further comprising: forming a second conductive layer on the color filter layer, the second conductive layer comprising a common electrode, wherein the color filter layer and the common electrode are further abutted in the direction perpendicular to the base substrate.

In an example, the first conductive layer further comprises a data line connected to a source electrode of the switching element, and the second conductive layer further comprises a common line connected to the common electrode, and the color filter layer is configured to electrically isolate the data line from the common line at an intersection of the data line and the common line.

In an example, forming the color filter layer on the first conductive layer comprises: forming a first color filter pattern layer and a second color filter pattern layer which are different in color on the first conductive layer, the first color filter pattern layer and the second color filter pattern layer being adjacent to each other, without gap at an interface therebetween; and removing a part of at least one of the first color filter pattern layer and the second color filter pattern layer at the interface therebetween, so as to form a first color filter pattern, a second color filter pattern, and an opening located therebetween, the opening passing through the color filter layer, wherein the first conductive layer further comprises a drain electrode of the switching element, a part of the drain electrode is exposed by the opening, the drain electrode of the switching element overlaps with the first color filter pattern and the second color filter pattern in the direction perpendicular to the base substrate.

In an example, the manufacturing method further comprising: forming a passivation layer on the second conductive layer; and forming a pixel electrode layer on the passivation layer, wherein a via hole is formed in the passivation layer, the via hole is located directly above the part of the drain electrode exposed by the opening, and the pixel electrode layer is connected to the drain electrode of the switching element through the via hole.

In an example, wherein a material of the color filter layer is a photoresist resin, and removing the part of the at least one of the first color filter pattern layer and the second color filter pattern layer at the interface therebetween is performed by an exposure and development process.

In an example, after removing the part of the at least one of the first color filter pattern layer and the second color filter pattern layer at the interface therebetween, the manufacturing method further comprises: baking the first color filter pattern layer and the second color filter pattern layer.

In an example, wherein the first conductive layer farther comprises a data line connected to the source electrode of the switching element, at least a part of an interface between the first color filter pattern and the second color filter pattern is located directly above the data line.

In an example, at least a part of an interface between the first color filter pattern and the second color filter pattern is located directly above the data line.

In an example, the color filter layer further comprises a third color filter pattern and a gate line connected to the gate electrode of the switching element, the third color filter pattern and the first color filter pattern being adjacent to each other and different in color, wherein at least a part of an interface between the first color filter pattern and the third color filter pattern is located directly above the gate line.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Figure 1:
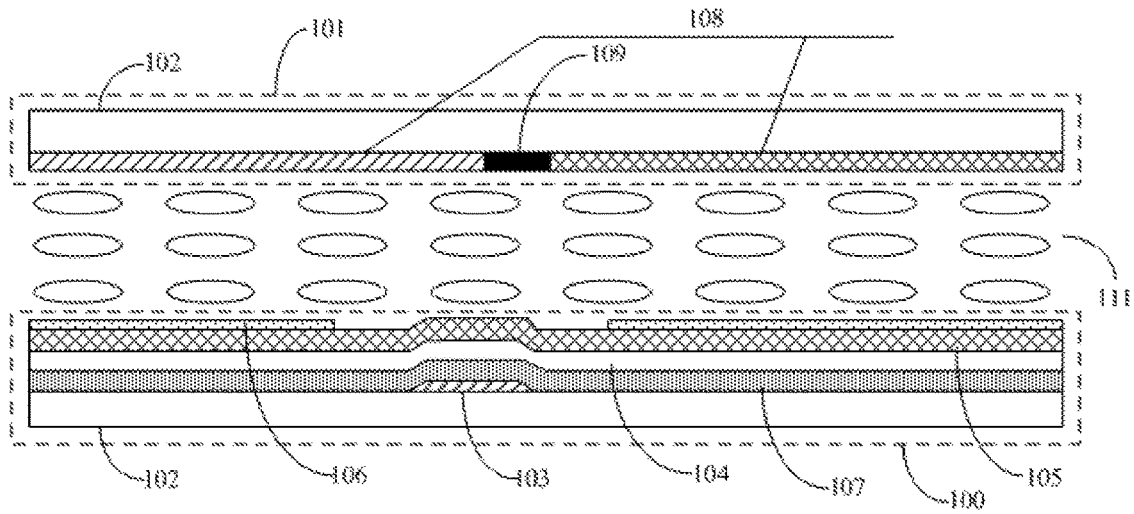
FIG. 1 illustrates a structure of a display panel.

As illustrated in FIG. 1, a TFT-LCD product of a low temperature poly-silicon (LTPS) includes an array substrate 100, a color filter substrate 101 and a liquid crystal layer (111) therebetween; the array substrate 100 and the color filter substrate 101 are opposite to each other. The array substrate 100 includes a data line 103 located on the base substrate 102, a resin layer 107 located on the data line 103, a common electrode 104 located on the resin layer 107, an insulation layer 105 located on the common electrode 104, a pixel electrode 106 located on the insulation layer 105. The color filter substrate 101 includes a color filter pattern 108 located on the base substrate 102 and a black matrix 109 between adjacent color filter patterns 108.

In the above-mentioned array substrate, the resin layer 107 serves as a planarization layer to block signal crosstalk between metal layers of the data line and the common electrode, and the color filter pattern is coated on the color filter substrate 101; manufacturing like that not only increase the thickness of the display panel, but also waste materials, resulting in complex process.

The embodiment of the present disclosure provides an array substrate, a manufacturing method thereof and a display device, so as to omit the resin layer in the above-mentioned technical solution, save costs and simplify process flow.

Figure 2:
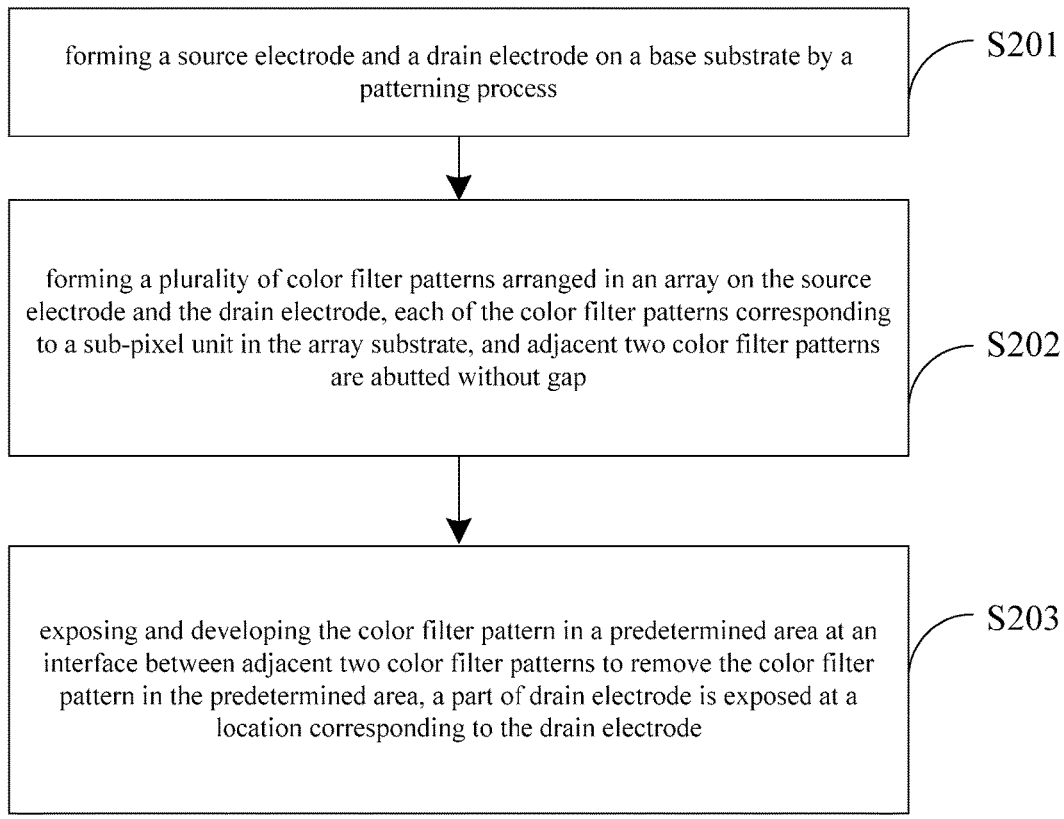
FIG. 2 is a flow chart of a manufacturing method of an array substrate according to an embodiment of the present disclosure.

As illustrated in FIG. 2, an embodiment of the present disclosure provides a manufacturing method of an array substrate, including:

S201, forming a source electrode and a drain electrode on a base substrate by a patterning process;

S202, forming a plurality of color filter patterns arranged in an array on the source electrode and the drain electrode, each of the color filter patterns corresponding to a sub-pixel unit in the array substrate, and adjacent two color filter patterns are abutted without gap;

S203, exposing and developing the color filter pattern in a predetermined area at an interface between adjacent two color filter patterns to remove the color filter pattern in the predetermined area, to expose a part of the drain electrode at a location corresponding to the drain electrode.

For example, the color filter patterns in an embodiment of the present disclosure include a red color filter pattern, a green color filter pattern, and a blue color filter pattern. Of course, in actual production, the color filter pattern can further include other colors such as a yellow color filter pattern. The following embodiments of the present disclosure are only described by taking the color filter patterns including the red color filter pattern, the green color filter pattern and the blue color filter pattern as an example.

According to a manufacturing method of an array substrate provided by an embodiment of the present disclosure, because a plurality of color filter patterns arranged in an array are fabricated on the source electrode and the drain electrode, adjacent two color filter patterns are abutted without gap therebetween, the color filter pattern formed by the embodiment of the present disclosure can play a flattening role and can block signal crosstalk between a source/drain electrode metal layer and a common electrode subsequently fabricated. Therefore, the embodiments of the present disclosure can omit the resin layer of existing technology, save cost and simplify process. In addition, because the color filter patterns in a predetermined area at an interface between adjacent two color filter patterns is exposed and developed so as to remove the color filter pattern(s) at the predetermined area, thereby separating the color filter patterns with different colors and avoiding color mixing between color filter patterns. In the embodiments of the present disclosure, the color filter patterns are manufactured on the array substrate, and so a thickness of the display panel can be reduced.

The manufacturing method of the array substrate provided in the embodiments of the present disclosure will be described in detail below with reference to the accompanying drawings. The thickness, area size, and shape of the layers in the drawings do not reflect the real scale of the layers, and are merely intended to illustrate the disclosure.

For example, the thin film transistor included in the array substrate according to the embodiments of the present disclosure can be a bottom-gate thin-film transistor or a top-gate thin-film transistor. Of course, other types of thin-film transistors can be used in actual production. For example, the thin film transistor can be a side-gate type thin film transistor. The embodiments of the present disclosure are mainly described by taking a top-gate type thin film transistor and a bottom-gate type thin film transistor as an example.

In an embodiment of the present disclosure, an example is described in which a thin film transistor included in an array substrate is a top-gate type thin film transistor.

Figure 3:
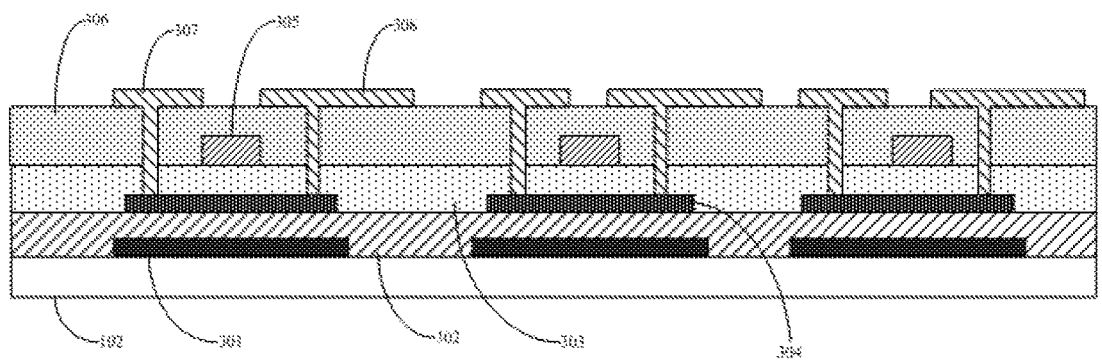
FIG. 3 to FIG. 9 are cross-sectional structural diagrams of different stages of a manufacturing process of an array substrate according to an embodiment of the present disclosure.

As illustrated in FIG. 3, before forming a source electrode and a drain electrode on a base substrate by a patterning process according to the embodiment of the present disclosure, the method further includes: forming a light shielding layer 301 on the base substrate 102 by a patterning process. The patterning process in the embodiment of the present disclosure includes coating, exposing, developing of photoresist, and removing part or all of the photoresist. For example, a metal layer is deposited on the base substrate 102; then, the metal layer is exposed and developed to form a shielding pattern, and then the metal layer is wet-etched, and finally the remaining photoresist is removed to form a light-shielding layer 301. The base substrate 102 according to the embodiment of the present disclosure can be a glass substrate, a quartz substrate, or a flexible substrate. The metal layer deposited according to the embodiment of the present disclosure can be any single metal layer of molybdenum (Mo), aluminum (Al), nickel (Ni), or multiple metal layers formed of any combination of the above-mentioned metals.

As illustrated in FIG. 3, next, a buffer layer 302 is formed on the light-shielding layer 301, and a semiconductor active layer 304 is formed on the buffer layer 302 through a patterning process. For example, the semiconductor active layer 304 in the embodiment of the present disclosure is a low-temperature poly-silicon semiconductor active layer. In implementation, an amorphous silicon layer is deposited on the buffer layer 302, and then the amorphous silicon layer is exposed and developed to form a semiconductor active layer pattern, and then the amorphous silicon layer is dry-etched, and finally remaining photoresist is removed, and an excimer laser annealing treatment on the formed amorphous silicon layer is performed to form the semiconductor active layer 304.

As illustrated in FIG. 3, next, a first insulation layer 303 is formed on the semiconductor active layer 304, and a gate electrode 305 is fabricated on the first insulation layer 303 through a patterning process In implementation, a metal layer is deposited on the first insulation layer 303, and then the metal layer is exposed and developed to form a gate pattern, and then the metal layer is wet-etched, and finally the remaining photoresist is removed, the gate electrode 305 is formed. The metal layer deposited in the embodiment of the present disclosure can be any single metal layer of molybdenum (Mo), aluminum (Al), nickel (Ni), or the like, or can be a multiple metal layers of any combination of the above-mentioned metals, As illustrated in FIG. 3, next, a second insulation layer 306 is formed on the gate electrode 305 through a patterning process. The material of the second insulation layer 306 in the embodiment of the present disclosure can be the same as or different from the material of the first insulation layer 303. The second insulation layer 306 can be silicon oxide or silicon nitride, or can be a combination of silicon oxide and silicon nitride. In implementation, an insulation film layer is deposited on the gate electrode 305, and then the insulation film layer is exposed and developed to form a second insulation layer pattern, and then the insulation film layer is dry-etched, and finally the remaining photoresist is removed to form the second insulation layer 306.

As illustrated in FIG. 3, next, a source electrode 307 and a drain electrode 308 are formed on the second insulation layer 306 through a patterning process. The material of the source electrode 307 and the drain electrode 308 according to the embodiment of the present disclosure can be the same as that of the gate electrode 305; of course, different materials can also be used. In order to save the material cost, the materials of the source electrode 307 and the drain electrode 308 are the same as the material of the gate electrode 305. In implementation, a metal layer can be deposited on the second insulation layer 306, and then the metal layer and is exposed and developed to form patterns of source electrode and drain electrode, and then the metal layer is wet or dry etched, and finally the remaining photoresist is removed to form the source electrode 307 and the drain electrode 308.

Figure 4:
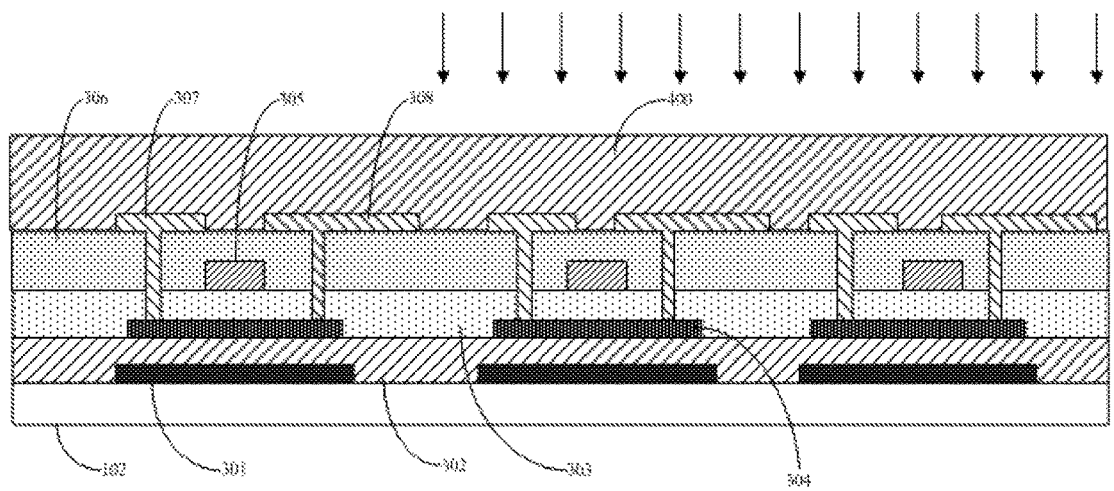
Figure 5:
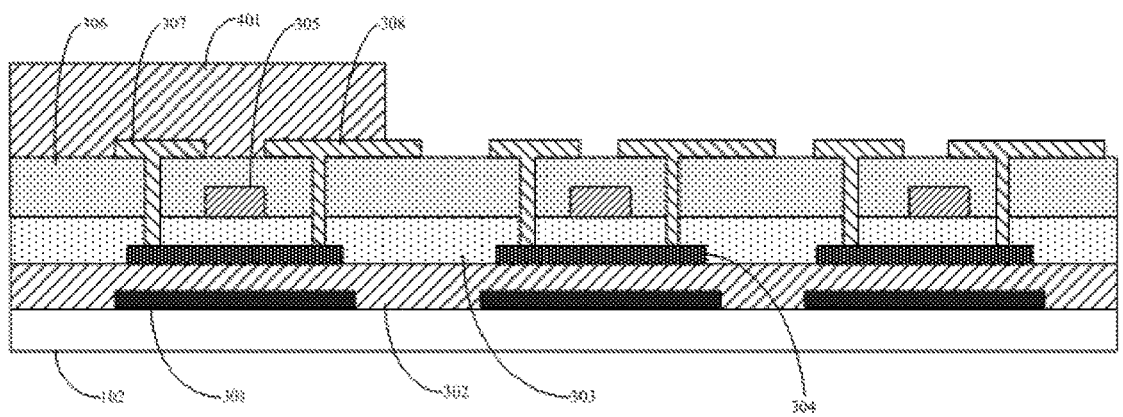

As illustrated in FIG. 4, next, a red resin layer 400 is formed on the source electrode 307 and the drain electrode 308. For example, the red photoresist resin layer 400 can be made by spin coating or the like. The red photoresist resin layer 400 is exposed and developed. The black arrow direction in the figure indicates light transmission direction during an exposing process. The material properties of the red photoresist resin layer 400 in the embodiment of the present disclosure can be the same as that of the resin layer 107 in FIG. 1, and a thickness of the red photoresist resin layer 400 can be the same as that of the resin layer 107 in FIG. 1. As illustrated in FIG. 5, after the red photoresist resin layer is developed, a red color filter pattern 401 corresponding to red sub-pixel units is formed.

Figure 6:
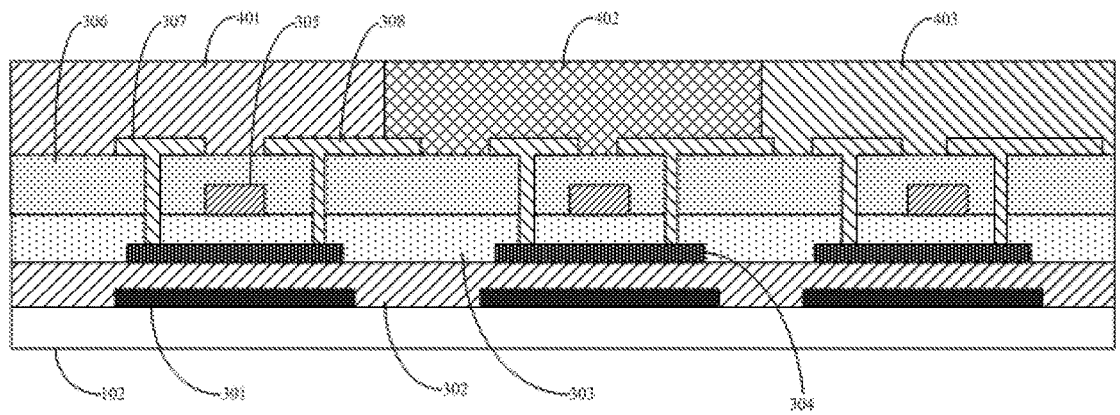

As illustrated in FIG. 6, next, the green color filter pattern 402 and the blue color filter pattern 403 are formed on the source electrode 307 and the drain electrode 308 by the same method, no gap presents between the red color filter pattern 401, the green color filter pattern 402 and the blue color filter pattern 403; an junction location of the red color filter pattern 401, the green color filter pattern 402 and the blue color filter pattern 403 are formed above the drain electrode 308.

For example, a green photoresist resin layer is spin-coated on the base substrate on which the red color filter pattern 401 is formed, and the green photoresist resin layer is exposed and developed to form a green color filter pattern corresponding to green sub-pixel unit. The green color filter pattern 402 and the red color filter pattern 401 are abutted without gap therebetween. A blue photoresist resin layer is spin-coated on the base substrate on which the green color filter pattern 402 is formed, the blue photoresist resin layer is exposed and developed to form a blue color filter pattern 403 corresponding to blue sub-pixel unit, and the blue color filter pattern 403 and the green color filter pattern 402 are abutted without gap therebetween.

Figure 7:
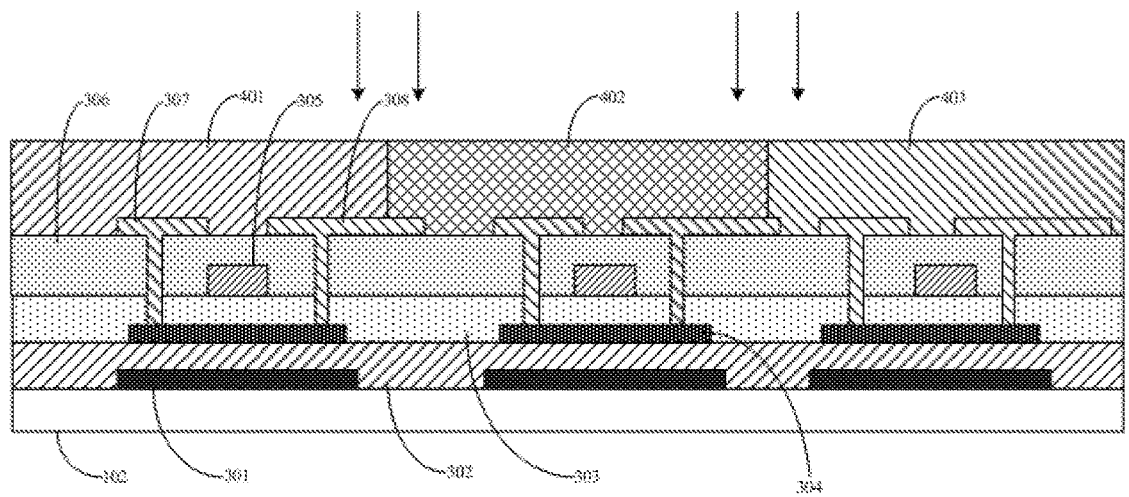

As illustrated in FIG. 7, next, a predetermined area of the red color filter pattern 401 and the green color filter pattern 402 at the interface therebetween are exposed and developed; and a predetermined area of the green color filter pattern 402 and the blue color filter pattern 403 at the interface therebetween are exposed and developed; the black arrow direction in the drawing indicates light travelling direction during an exposing process. The predetermined areas in the embodiment of the present disclosure is set according to actual production needs as long as a via hole formed after the development can ensure that the pixel electrode subsequently manufactured can be connected with the drain electrode and spacing generated between the color filter patterns can avoid color-cross.

Figure 8:
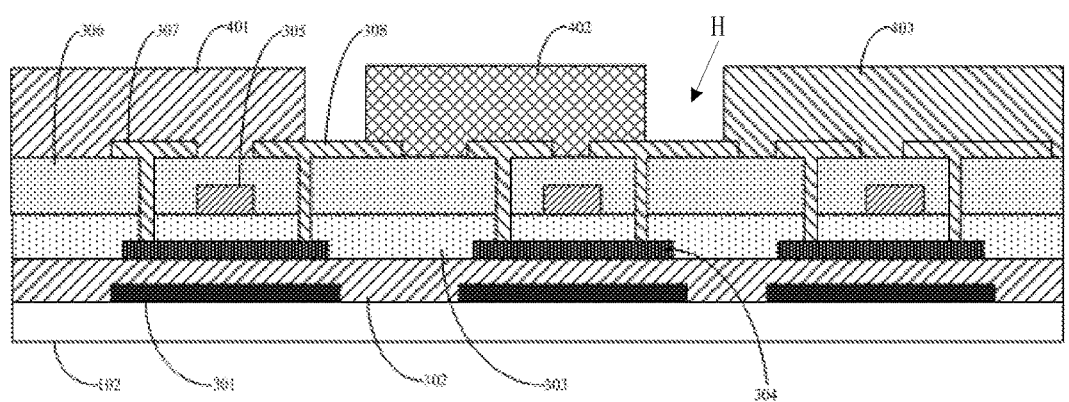

As illustrated in FIG. 8, after development, a via hole H (an example of the opening) passing through the red color filter pattern 401 and the green color filter pattern 402 is formed between adjacent red color filter pattern 401 and green color filter pattern 402, a part of the drain electrode 308 is exposed at the hole position; and a hole passing through the green color filter pattern 402 and the blue color filter pattern 403 is formed between adjacent green color filter pattern 402 and blue color filter pattern 403, a part of drain electrode 308 is exposed at the hole location.

For example, in the embodiment of the present disclosure, after exposing and developing the color photoresist resin layer in a predetermined area at the interface between adjacent two color filter patterns, the method further includes: baking the color photoresist resin layer after being exposed and developed within a predetermined temperature range to achieve curing effect. The predetermined temperature of the embodiment of the present disclosure is set according to actual production needs. For example, the red color filter pattern 401, the green color filter pattern 402, and the blue color filter pattern 403 as illustrated in FIG. 8 are baked for 40 minutes at 240° C.

The dielectric constant of the color filter pattern in the embodiment of the present disclosure is very close to the dielectric constant of the organic insulation film. Therefore, crosstalk between the source electrode 307 and the drain electrode 308 and the pixel electrode and the common electrode subsequently fabricated is small, without affecting original performance of the array substrate; the via hole makes a certain spacing between the color filter patterns, the underneath drain electrode exposed may also play a role in light blocking. The embodiments of the present disclosure effectively utilize the properties of high wiring density and light blocking of the metal layer of the source electrode 307 and the drain electrode 308, the wirings of the metal layer of the source electrode 307 and the drain electrode 308 plays a role of light blocking.

Figure 9:
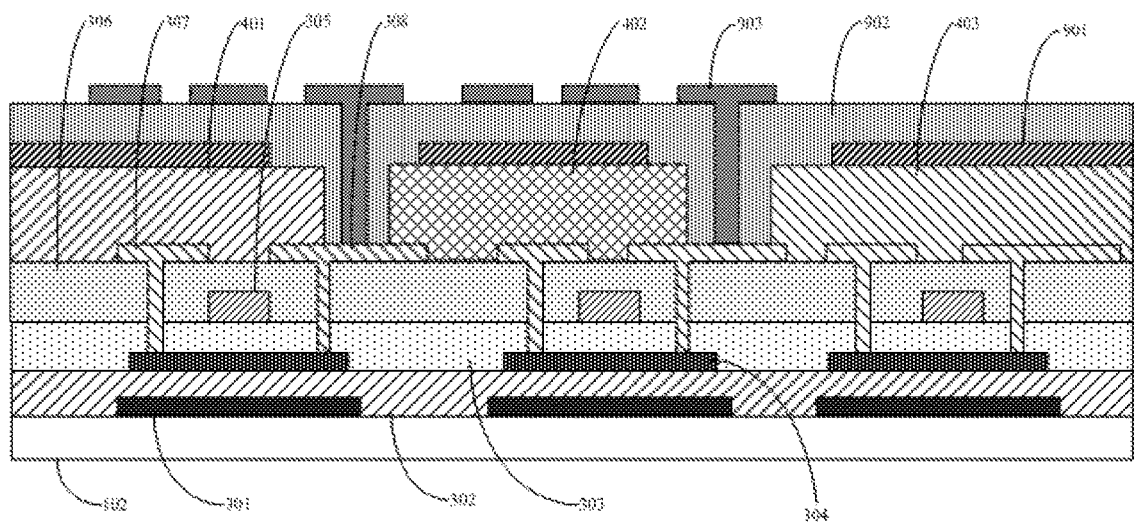

As illustrated in FIG. 9, next, a common electrode 901 is formed on the red color filter pattern 401, the green color filter pattern 402, and the blue color filter pattern 403 through a patterning process; and a passivation layer 902 is performed on the common electrode 901 through a patterning process; a pixel electrode 903 is formed on the passivation layer 902 through a patterning process, and the pixel electrode 903 is electrically connected to the exposed drain electrode 308. The manufacturing method of the common electrode 901, the passivation layer 902 and the pixel electrode 903 in the embodiments of the present disclosure can be the same as those in existing technology, and details are not described herein again. In this embodiment of the present disclosure, the material of the common electrode can be the same as or different from the material of the pixel electrode. In the production process, for example, the material of the common electrode is the same as that of the pixel electrode, and can be a single layer of indium tin oxide or indium zinc oxide or a multiple film layers of indium tin oxide and indium zinc oxide.

In the embodiments of the present disclosure, a pixel electrode 903 can also be formed on the red color filter pattern 401, the green color filter pattern 402, and the blue color filter pattern 403 through a patterning process first, and then a passivation layer 902 is formed on the pixel electrode 903 by a patterning process, a common electrode 901 is formed on the passivation layer 902 through a patterning process. In this case, the common electrode 901, the passivation layer 902 and the pixel electrode 903 can also be manufactured in the same manner as that in existing technology, and details are not described herein again.

Figure 10:
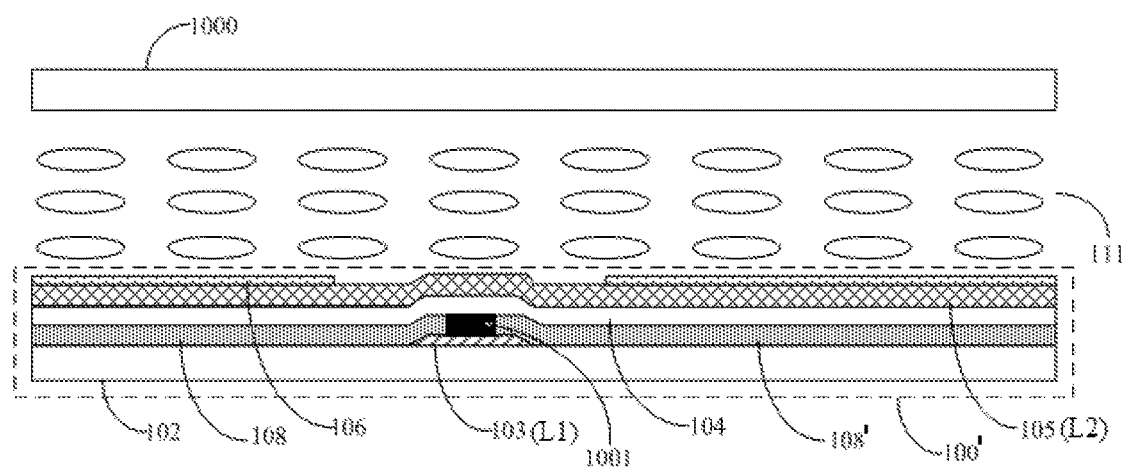
FIG. 10 is a schematic structural cross-sectional view of a display panel according to an embodiment of the present disclosure.

In addition, as illustrated in FIG. 10, an embodiment of the disclosure provides a display panel including an array substrate 100' according to an embodiment of the present disclosure, an opposing substrate 1000 opposite to the array substrate 100', and a liquid crystal layer 111 therebetween. In a cross-sectional structure of the array substrate 100' as illustrated in FIG. 10, a data line 103, a color filter layer 108', a common line 104, an insulation layer 105 and a pixel electrode layer 106 are sequentially formed on the base substrate 102. Herein, another layer structure (not illustrated) can be formed between the base substrate 102 and the data line 103. For example, the data line 103 is the same material and in the same layer as the source electrode and the drain electrode of the thin film transistor. For example, the data line 103 is formed integrally with the source electrode of the thin film transistor. Referring to FIG. 10, for example, the color filter layer 108' is configured to electrically isolate the common line 104 with the data line 103 at an intersection of the common line 104 and the data line 103. In addition to being capable of transmitting data signals and/or touch signals, the data lines in the embodiments of the present disclosure can also shield light from the backlight and play a role of a black matrix.

Referring to FIG. 10, for example, the color filter layer 108' can include a black matrix portion 1001 formed at an intersection of the common line 104 and the data line 103.

The color filter pattern 108' in the embodiments of the present disclosure is located on the array substrate. The display panel is not affected by the alignment errors of an upper and lower substrates, thereby reducing the occurrence of light leakage and color-cross defects. In addition, in the embodiments of the present disclosure, a recessed portion configured to receive the black matrix portion 1001 and formed directly above the data line 103 is formed in the steps as illustrated in FIG. 7 and FIG. 8, thereby forming a black matrix portion 1001 with smaller width, and the aperture ratio of the display panel can be further increased.

For example, in the present example, the first conductive layer L1 includes the data line 103, and the source electrode 307 and the drain electrode 308 of the thin film transistor. The second conductive layer L2 includes a common electrode 901 and a common line 104 connected thereto.

In an embodiment of the present disclosure, the thin film transistor included in the array substrate is a bottom-gate type thin film transistor.

Figure 11:
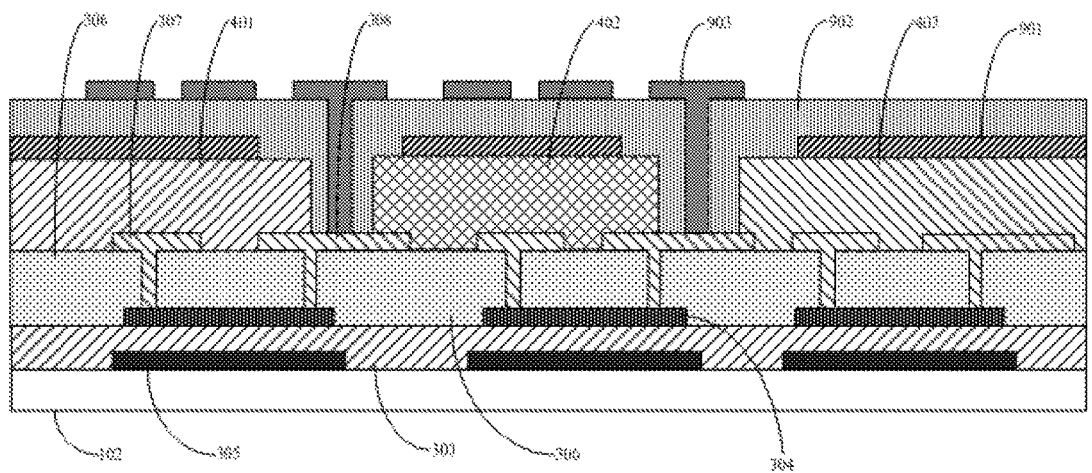
FIG. 11 is a schematic structural cross-sectional view of an array substrate according to an embodiment of the present disclosure.

As illustrated in FIG. 11, according to an embodiment of the present disclosure, before forming the source electrode 307 and the drain electrode 308 on the base substrate 102 through a patterning process, the method further includes: forming a gate electrode 305 on the base substrate 102 by a patterning process; forming a first insulation layer 303 on the gate electrode 305, forming a semiconductor active layer 304 on the first insulation layer 303 through a patterning process, and forming a second insulation layer 306 on the semiconductor active layer 304 through a patterning process. The manufacturing method of the gate electrode 305, the first insulation layer 303, the semiconductor active layer 304 and the second insulation layer 306 according to the embodiment of the present disclosure can be the same as those in existing technology, and details are not described herein again.

Next, as illustrated in FIG. 11, a source electrode 307 and a drain electrode 308 are formed on the second insulation layer 306 through a patterning process. The forming method of the source electrode 307 and the drain electrode 308 is the same as that in the embodiment of the present disclosure, and details are not described herein again. Next, a red color filter pattern 401, a green color filter pattern 402 and a blue color filter pattern 403 are fabricated on the source electrode 307 and the drain electrode 308, and the forming method of the red color filter pattern 401, the green color filter pattern 402 and the color filter pattern 403 is the same as that in the embodiment of the present disclosure, and details are not described herein again.

Next, as illustrated in FIG. 11, a common electrode 901 is fabricated on the red color filter pattern 401, the green color filter pattern 402, and the blue color filter pattern 403 through a patterning process, and a passivation layer 902 is fabricated on the common electrode 901 through a patterning process, and a pixel electrode 903 is fabricated on the passivation layer 902 through a patterning process. The manufacturing method of the common electrode 901, the passivation layer 902 and the pixel electrode 903 according to the embodiment of the present disclosure can be the same as those in existing technology, and details are not described herein again.

For example, in the present example, the first conductive layer L1 includes the data line 103, the source electrode 307 and the drain electrode 308 of the thin film transistor. The second conductive layer L2 includes a common electrode 901 and a common line 104 connected thereto.

In another example, a pixel electrode 903 can also be formed by a patterning process on the red color filter pattern 401, the green color filter pattern 402, and the blue color filter pattern 403 first, and then a passivation layer 902 is formed on the pixel electrode 903 by a patterning process, and a common electrode 901 is formed on the passivation layer 902 through a patterning process. In this case, the common electrode 901, the passivation layer 902 and the pixel electrode 903 can be manufactured in the same manner as in existing technology, and details are not described herein again.

Based on the same inventive concept, as illustrated in FIG. 9 and FIG. 11, an embodiment of the disclosure further provides an array substrate including a source electrode 307 and a drain electrode 308 located on a base substrate 102, and color filter patterns (red color filter pattern 401, green color filter pattern 402, and blue color filter pattern 403) arranged in an array on the source electrode 307 and the drain electrode 308. Each of the color filter patterns corresponds to a sub-pixel unit of the array substrate. A gap passes through the color filter pattern. In a predetermined area between adjacent two color filter patterns, and a part of the drain electrode 308 is exposed at a gap position corresponding to the position of the drain electrode 308.

For example, as illustrated in FIG. 9, the array substrate according to the embodiment of the present disclosure includes, for example, a light-shielding layer 301, a buffer layer 302, a semiconductor active layer 304, a first insulation layer 303, a gate electrode 305, a second insulation layer 306, a source electrode 307 and a drain electrode 308, a color filter pattern (a red color filter pattern 401, a green color filter pattern 402 and a blue color filter pattern 403), a common electrode 901, a passivation layer 902 and a pixel electrode 903 sequentially disposed on the base substrate 102. Of course, the array substrate according to an embodiment of the present disclosure can include a light-shielding layer 301, a buffer layer 302, a semiconductor active layer 304, a first insulation layer 303, a gate electrode 305, a second insulation layer 306, a source electrode 307 and a drain electrode 308, a color filter pattern (a red color filter pattern 401, a green color filter pattern 402 and a blue color filter pattern 403), a pixel electrode 903, a passivation layer 902, and a common electrode 901 sequentially disposed on the base substrate 102.

For example, as illustrated in FIG. 11, the array substrate according to the embodiment of the present disclosure includes a gate electrode 305, a first insulation layer 303, a semiconductor active layer 304, a second insulation layer 306, a source electrode 307 and a drain electrode 308, a color filter pattern (a red color filter pattern 401, a green color filter pattern 402 and a blue color filter pattern 403), a common electrode 901, a passivation layer 902, and a pixel electrode 903 sequentially disposed on the base substrate 102. Of course, the array substrate according to an embodiment of the present disclosure can include a gate electrode 305, a first insulation layer 303, a semiconductor active layer 304, a second insulation layer 306, a source electrode 307 and a drain electrode 308, a color filter pattern (a red color filter pattern 401, a green color filter pattern 402, and a blue color filter pattern 403), a pixel electrode 903, a passivation layer 902, and a common electrode 901 sequentially disposed on the base substrate 102.

Figure 12:
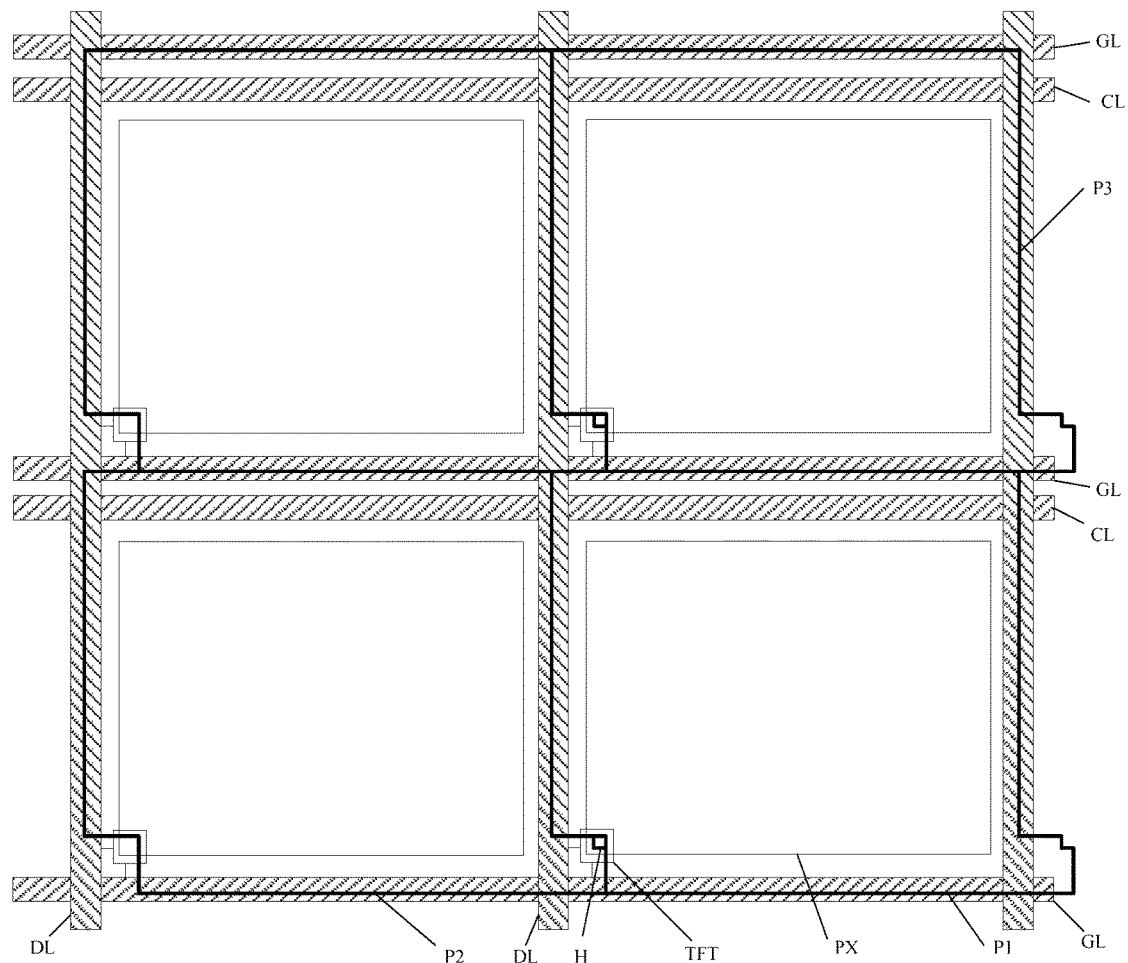
FIG. 12 is a schematic structural plan view of an array substrate according to an embodiment of the present disclosure.

In FIG. 12, the gate line GL, the common line CL and the data line DL define four sub-pixel units. Each sub-pixel unit includes a thin film transistor TFT (as an example of a switching element) and a sub-pixel electrode PX. In FIG. 12, for simplifying explanation, the common electrode in each sub-pixel unit is not illustrated. The gate electrode of the thin film transistor TFT is connected to the gate line GL, the source electrode thereof is connected to the data line DL, and the drain electrode thereof is connected to the pixel electrode PX. In FIG. 12, the thin film transistor TFT is illustrated with only its drain electrode shown. In FIG. 12, the lower right and upper left sub-pixel units further include, for example, a red color filter pattern P1; the lower left sub-pixel unit further includes a green color filter pattern P2; for example, the upper right sub-pixel unit further includes a blue filter pattern P3. The red color filter pattern P1 and the green color filter pattern P2 are provided with an opening directly above the drain electrode of the TFT. A part of the drain electrode is exposed by the opening H.

Based on the same inventive concept, embodiments of the present disclosure further provide a display device including the above-mentioned array substrate provided in the embodiments of the present disclosure. The display device can be a liquid crystal panel, a liquid crystal display, a liquid crystal television, an organic light emitting diode (OLED) panel, an OLED display, an OLED television or an electronic paper.

In summary, the embodiments of the present disclosure provide a manufacturing method of an array substrate, including: forming a source electrode and a drain electrode on a base substrate through a patterning process; and forming some color filter patterns arranged in an array on the source electrode and the drain electrode. Each of the color filter patterns corresponds to a sub-pixel unit of the array substrate, adjacent two color filter patterns are abutted without gap; and the color filter patterns in a predetermined area at an interface between adjacent two color filter patterns is exposed and developed, so as to remove the color filter patterns in the predetermined area and expose a part of the drain electrode at a position corresponding to the drain electrode. Because the manufacturing method forms a plurality of color filter patterns arranged in an array on the source electrode and the drain electrode, adjacent two color filter patterns are abutted without gap, the color filter patterns formed by the embodiments of the present disclosure can play a flat role and can block signal crosstalk between a metal layer of the source electrode and drain electrode and the common electrode which is subsequently fabricated. Therefore, the embodiments of the present disclosure can omit the resin layer of existing technology, save cost, and simplify process. In addition, because in the embodiment of the present disclosure, the color filter pattern in the predetermined area at the interface between adjacent two color filter patterns is exposed and developed, the color filter pattern in the predetermined area is removed, the color filter patterns of different colors can be separated to avoid color mixing between the color filter patterns. In the embodiments of the present disclosure, the color filter patterns are fabricated on the array substrate, thereby reducing the thickness of the display panel.

Obviously, those skilled in the art can make various modifications and variations to the present disclosure without departing from the spirit and scope of the disclosure. In this way, if these modifications and variations of the disclosure fall within the scope of the claims of the disclosure and the equivalent technologies, the disclosure is also intended to include these modifications and variations.

The above descriptions are merely exemplary embodiments of the present disclosure, not intended to limit the protection scope of the present disclosure. The protection scope of the disclosure is determined by the appended claims.

The application claims priority to the Chinese patent application No. 201611238390.1, filed Dec. 28, 2016, the entire disclosure of which is incorporated herein by reference as part of the present application.

The invention claimed is:

1. An array substrate, comprising:
   a base substrate,
   a first conductive layer located on the base substrate, the first conductive layer comprising a source electrode of a switching element, and
   a color filter layer located on the first conductive layer,
   wherein, the source electrode of the switching element and the color filter layer are abutted in a direction perpendicular to the base substrate;
   the color filter layer comprises a first color filter pattern and a second color filter pattern, the first color filter pattern and the second color filter pattern are adjacent to each other and different in color;
   the first conductive layer further comprises a data line connected to the source electrode of the switching element, and at least a part of an interface between the first color filter pattern and the second color filter pattern is located directly above the data line.

2. The array substrate according to claim 1, further comprising:
   a second conductive layer located on the color filter layer, the second conductive layer comprising a common electrode,
   wherein, the color filter layer and the common electrode are further abutted in the direction perpendicular to the base substrate.

3. The array substrate according to claim 2, wherein the second conductive layer further comprises a common line connected to the common electrode, and the color filter layer is configured to electrically isolate the data line from the common line at an intersection of the data line and the common line.

4. The array substrate according to claim 1, wherein,
   the color filter layer further comprises an opening located between the first color filter pattern and the second color filter pattern and passing through the color filter layer;
   the first conductive layer further comprises a drain electrode of the switching element, a part of the drain electrode is exposed by the opening,
   the drain electrode of the switching element overlaps with the first color filter pattern and the second color filter pattern in the direction perpendicular to the base substrate.

5. The array substrate according to claim 4, further comprising:
   a passivation layer located on the second conductive layer; and
   a pixel electrode layer located on the passivation layer,
   wherein a via hole is formed in the passivation layer, the via hole is located directly above the part of the drain electrode exposed by the opening, and the pixel electrode layer is connected to the drain electrode of the switching element through the via hole.

6. The array substrate according to claim 1, wherein the color filter layer further comprises a third color filter pattern adjacent to the first color filter pattern and a gate line is connected to a gate electrode of the switching element, the first color filter pattern and the third color filter pattern are different in color; at least a part of an interface between the first color filter pattern and the third color filter pattern is located directly above the gate line.

7. The array substrate according to claim 1, wherein a material of the color filter layer is a photoresist resin.

8. A display device comprising the array substrate according to claim 1.

9. A manufacturing method of an array substrate, comprising:
   forming a first conductive layer on a base substrate, the first conductive layer comprising a source electrode of a switching element; and
   forming a color filter layer on the first conductive layer,
   wherein the color filter layer and the source electrode of the switching element are abutted in a direction perpendicular to the base substrate,
   forming the color filter layer on the first conductive layer comprises: forming a first color filter pattern layer and a second color filter pattern layer which are different color on the first conductive layer, the first color filter pattern layer and the second color filter pattern layer being adjacent to each other, without gap at an interface therebetween; and
   removing a part of at least one of the first color filter pattern layer and the second color filter pattern layer at the interface therebetween, so as to form a first color filter pattern, a second color filter pattern, and an opening therebetween, the opening passing through the color filter layer,
   the first conductive layer further comprises a data line connected to the source electrode of the switching element, at least a part of an interface between the first color filter pattern and the second color filter pattern is located directly above the data line.

10. The manufacturing method according to claim 9, further comprising:

forming a second conductive layer on the color filter layer, the second conductive layer comprising a common electrode,
wherein the color filter layer and the common electrode are further abutted in the direction perpendicular to the base substrate.

11. The manufacturing method according to claim 10, wherein the second conductive layer further comprises a common line connected to the common electrode, and the color filter layer is configured to electrically isolate the data line from the common line at an intersection of the data line and the common line.

12. The manufacturing method according to claim 9, wherein the first conductive layer further comprises a drain electrode of the switching element, a part of the drain electrode is exposed by the opening,
the drain electrode of the switching element overlaps with the first color filter pattern and the second color filter pattern in the direction perpendicular to the base substrate.

13. The manufacturing method according to claim 12, further comprising:
forming a passivation layer on the second conductive layer; and
forming a pixel electrode layer on the passivation layer, wherein a via hole is formed in the passivation layer, the via hole is located directly above the part of the drain electrode exposed by the opening, and the pixel electrode layer is connected to the drain electrode of the switching element through the via hole.

14. The manufacturing method according to claim 12, wherein a material of the color filter layer is a photoresist resin, and removing the part of the at least one of the first color filter pattern layer and the second color filter pattern layer at the interface therebetween is performed by an exposure and development process.

15. The manufacturing method according to claim 12, wherein after removing the part of the at least one of the first color filter pattern layer and the second color filter pattern layer at the interface therebetween, the manufacturing method further comprises:
baking the first color filter pattern layer and the second color filter pattern layer.

16. The manufacturing method according to claim 9, wherein the color filter layer further comprises a third color filter pattern and a gate line is connected to the gate electrode of the switching element, the third color filter pattern and the first color filter pattern are adjacent to each other and different in color, at least a part of an interface between the first color filter pattern and the third color filter pattern is located directly above the gate line.

* * * * *